United States Patent
Chen et al.

(10) Patent No.: US 11,322,477 B2
(45) Date of Patent: May 3, 2022

(54) PACKAGE STRUCTURE AND METHOD OF FABRICATING THE SAME

(71) Applicant: Taiwan Semiconductor Manufacturing Co., Ltd., Hsinchu (TW)

(72) Inventors: Ming-Fa Chen, Taichung (TW); Nien-Fang Wu, Chiayi (TW); Sung-Feng Yeh, Taipei (TW); Tzuan-Horng Liu, Taoyuan (TW); Chao-Wen Shih, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1 day.

(21) Appl. No.: 16/896,219

(22) Filed: Jun. 9, 2020

(65) Prior Publication Data

US 2021/0098420 A1   Apr. 1, 2021

Related U.S. Application Data

(60) Provisional application No. 62/906,730, filed on Sep. 27, 2019.

(51) Int. Cl.
| | |
|---|---|
| *H01L 25/065* | (2006.01) |
| *H01L 23/538* | (2006.01) |
| *H01L 25/00* | (2006.01) |
| *H01L 21/56* | (2006.01) |
| *H01L 21/683* | (2006.01) |
| *H01L 23/00* | (2006.01) |

(Continued)

(52) U.S. Cl.
CPC ........ *H01L 25/0652* (2013.01); *H01L 21/561* (2013.01); *H01L 21/6835* (2013.01); *H01L 23/3128* (2013.01); *H01L 23/5385* (2013.01); *H01L 23/5386* (2013.01); *H01L 23/544* (2013.01); *H01L 24/32* (2013.01); *H01L 24/83* (2013.01); *H01L 25/50* (2013.01); *H01L 2223/54426* (2013.01); *H01L 2224/32225* (2013.01); *H01L 2224/83005* (2013.01); *H01L 2224/83896* (2013.01); *H01L 2225/06541* (2013.01); *H01L 2225/06586* (2013.01)

(58) Field of Classification Search
CPC ............. H01L 25/0657; H01L 23/3128; H01L 2224/32225; H01L 24/83; H01L 2224/83005; H01L 25/0652; H01L 25/50; H01L 23/544; H01L 23/5386; H01L 21/561; H01L 24/19

See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |

(Continued)

*Primary Examiner* — Jasmine J Clark
(74) *Attorney, Agent, or Firm* — JCIPRNET

(57) ABSTRACT

A structure including stacked substrates, a first semiconductor die, a second semiconductor die, and an insulating encapsulation is provided. The first semiconductor die is disposed over the stacked substrates. The second semiconductor die is stacked over the first semiconductor die. The insulating encapsulation includes a first encapsulation portion encapsulating the first semiconductor die and a second encapsulation portion encapsulating the second semiconductor die.

20 Claims, 11 Drawing Sheets

(51) Int. Cl.
*H01L 23/544* (2006.01)
*H01L 23/31* (2006.01)

(56) References Cited

U.S. PATENT DOCUMENTS

| | | |
|---|---|---|
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2014/0327150 A1* | 11/2014 | Jung ................. H01L 23/291 257/774 |
| 2016/0276309 A1* | 9/2016 | Paek ................. H01L 24/20 |
| 2018/0076179 A1* | 3/2018 | Hsu ................. H01L 24/17 |

* cited by examiner

PACKAGE STRUCTURE AND METHOD OF FABRICATING THE SAME

CROSS-REFERENCE TO RELATED APPLICATION

This application claims the priority benefit of U.S. provisional application Ser. No. 62/906,730, filed on Sep. 27, 2019. The entirety of each of the above-mentioned patent applications is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies. Currently, System-on-Integrated-Chip (SoIC) components are becoming increasingly popular for their multi-functions and compactness. However, there are challenges related to packaging process of the SoIC components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
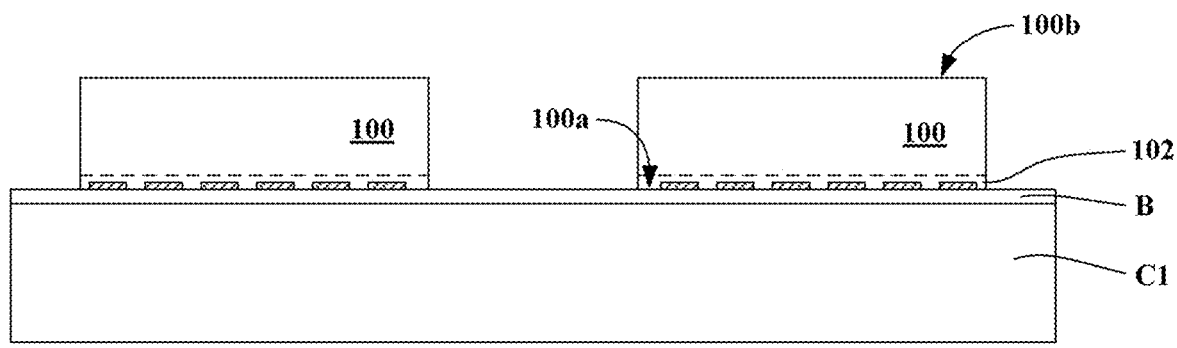
FIG. 1 through FIG. 10 are cross-sectional views schematically illustrating a process flow for fabricating an SoIC component in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 through FIG. 10 are cross-sectional views schematically illustrating a process flow for fabricating an SoIC component in accordance with some embodiments of the present disclosure.

Referring to FIG. 1, a semiconductor carrier C1 including a bonding layer B formed on a surface thereof is provided. The semiconductor carrier C1 may be a semiconductor wafer, and the bonding layer B may be a bonding layer prepared for fusion bond. In some embodiments, the bonding layer B is a deposited layer formed over the top surface of the semiconductor carrier C1. In some alternative embodiments, the bonding layer B is a portion of the semiconductor carrier C1 for fusion bond. For example, the material of the semiconductor carrier C1 includes silicon or other suitable semiconductor materials, and the material of the bonding layer B includes silicon (Si), silicon dioxide ($SiO_2$) or other suitable bonding materials. In some other embodiments, the bonding layer B is a native oxide layer naturally grown on the surface of the semiconductor carrier C1.

Semiconductor dies 100 (e.g., logic dies) are provided and placed on the top surface of the bonding layer B. Each one of the semiconductor dies 100 may include an active surface 100a (i.e. front surface) and a back surface 100b opposite to the active surface 100a, respectively. Each one of the semiconductor dies 100 may include a bonding portion 102, respectively. The semiconductor dies 100 are placed on the top surface of the bonding layer B such that the active surfaces 100a of the semiconductor dies 100 face the bonding layer B, and the bonding portions 102 of the semiconductor dies 100 are in contact with the top surface of the bonding layer B. The semiconductor dies 100 may be placed onto the bonding layer B in a side-by-side manner such that semiconductor dies 100 are spaced apart from each other. In some embodiments, the material of the bonding layer 102 includes silicon (Si), silicon dioxide ($SiO_2$) or other suitable bonding materials.

After the semiconductor dies 100 are picked up and placed on the bonding layer B, a chip-to-wafer fusion bonding process may be performed such that a fusion bonding interface is formed between the bonding layer B and the bonding portions 102 of the semiconductor dies 100. For example, the fusion bonding process for bonding the bonding layer B and the bonding portions 102 of the semiconductor dies 100 is performed at temperature ranging from about 250 Celsius degree to about 400 Celsius degree. The bonding layer B may be directly bonded to the bonding portions 102 of the semiconductor dies 100. In other words, there is no intermediate layer formed between the bonding layer B and the bonding portions 102 of the semiconductor dies 100. The above-mentioned fusion bonding interface formed between the bonding layer B and the bonding portions 102 of the semiconductor dies 100 may be or include a Si—Si fusion bonding interface, a Si—$SiO_2$ fusion bonding interface, a $SiO_2$—$SiO_2$ fusion bonding interface or other suitable fusion bonding interfaces.

Figure 2:
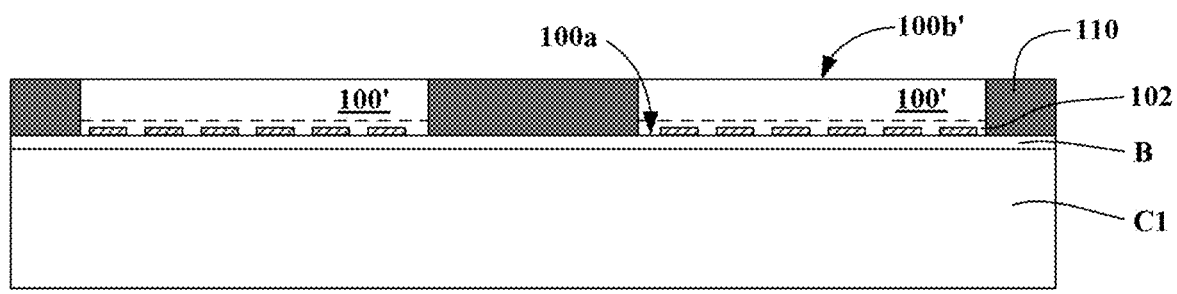

Referring to FIG. 1 and FIG. 2, after the semiconductor dies 100 are bonded to the bonding layer B, an insulating material is formed to cover the bonding layer B and the semiconductor dies 100. In some embodiments, the insulating material is formed by an over-molding process such that back surfaces 100b and side surfaces of the semiconductor dies 100 (illustrated in FIG. 1) are covered by the insulating material. After performing the over-molding process, a grinding process may be performed to reduce the thickness of the insulating material and the thickness of the semiconductor die 100 (illustrated in FIG. 1) such that semiconductor dies 100' with reduced thickness and a first encapsulation portion 110 are formed over the bonding layer B. In some embodiments, the grinding process for reducing the thickness of the insulating material and the thickness of the semiconductor die 100 (illustrated in FIG. 1) includes a mechanical grinding process, a chemical mechanical polishing (CMP) process, or combinations thereof.

As illustrated in FIG. 2, in some embodiments, the thickness of the semiconductor dies 100' is equal to the thickness of the first encapsulation portion 110, and the semiconductor dies 100' are laterally encapsulated by the first encapsulation portion 110. In other words, the first encapsulation portion 110 is merely in contact with side surfaces of the semiconductor dies 100', and back surfaces 100b' of the semiconductor dies 100' are accessibly revealed by the first encapsulation portion 110. In some alternative embodiments, not illustrated in FIG. 2, the thickness of the semiconductor dies is slightly less than or greater than the thickness of the first encapsulation portion due to polishing selectivity of the grinding process. In other words, the top surface of the first encapsulation portion may be slightly higher than or slightly lower than the back surface of the semiconductor dies.

Figure 3:
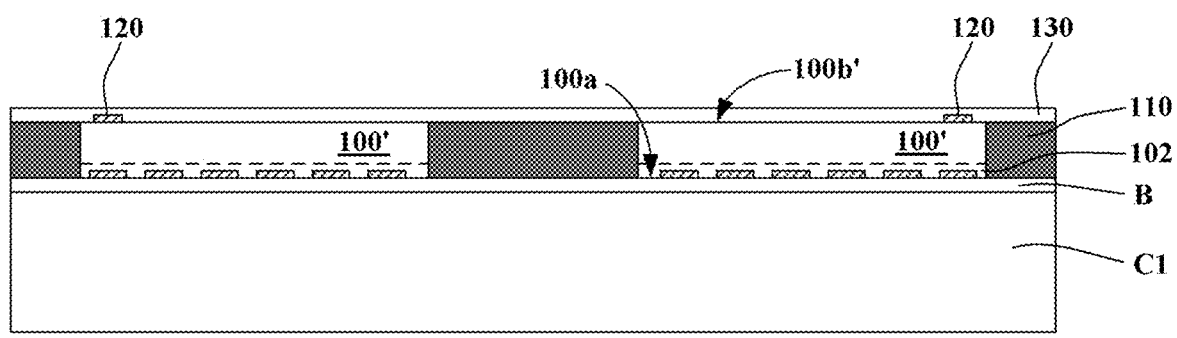

Referring to FIG. 3, in some embodiments, alignment marks 120 are formed over the back surfaces 100b' of the semiconductor dies 100'. In some alternative embodiments, alignment marks are formed over the top surface of the first encapsulation portion. The number, the shape, and the position of the alignment marks 120 are not limited in the present invention. The alignment marks 120 may be formed by deposition, photolithography, and etch processes. In some embodiments, metallic material is deposited over the back surfaces 100b' of the semiconductor dies 100' and the top surface of the first encapsulation portion 110, and the deposited metallic material is then patterned through, for example, a photolithography process followed by an etch process.

After forming the alignment marks 120, a bonding layer 130 may be formed over the back surfaces 100b' of the semiconductor dies 100' and the top surface of the first encapsulation portion 110 such that the alignment marks 120 are covered by the bonding layer 130. The bonding layer 130 may be formed through a chemical vapor deposition (CVD) process or other suitable deposition process. The bonding layer 130 may be a bonding layer prepared for fusion bond, and the material of the bonding layer 130 may include silicon (Si), silicon dioxide ($SiO_2$) or other suitable bonding materials. In some embodiments, the bonding layer 130 has a planar top surface.

Figure 4:
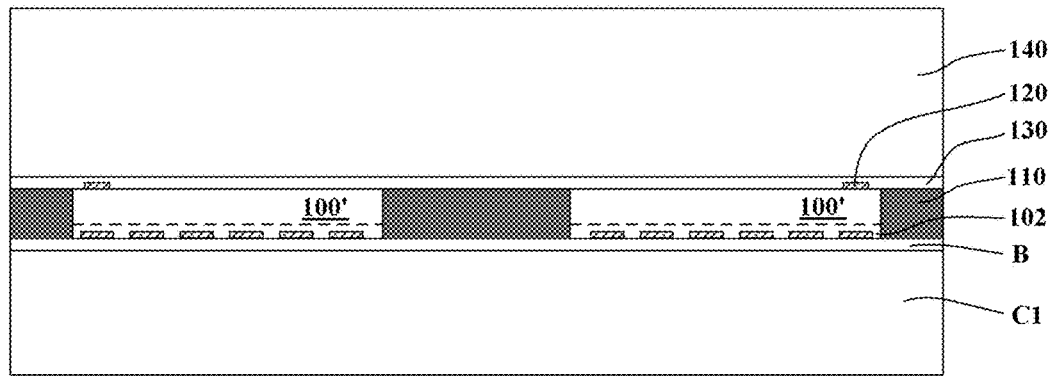

Referring to FIG. 4, after forming the alignment marks 120 and the bonding layer 130, a support substrate 140 for warpage control is provided and placed over the bonding layer 130. The support substrate 140 is aligned with the resulted structure illustrated in FIG. 3 by using the alignment marks 120. The thickness of the support substrate 140 may range from about 750 micrometers to about 800 micrometers. For example, as illustrated in FIG. 4, the support substrate 140 is a semiconductor wafer (e.g., a silicon wafer), and the thickness of the support substrate 140 is about 775 micrometers. In some embodiments, a wafer-to-wafer fusion bonding process is performed such that a fusion bonding interface is formed between the support substrate 140 and the bonding layer 130. For example, the fusion bonding process for bonding the support substrate 140 and the bonding layer 130 is performed at temperature ranging from about 250 Celsius degree to about 400 Celsius degree. The support substrate 140 may be directly bonded to the bonding layer 130. In other words, there is no intermediate layer formed between the support substrate 140 and the bonding layer 130. In some alternative embodiments, not illustrated in FIG. 4, the support substrate is a semiconductor wafer (e.g., silicon wafer) having a dielectric bonding layer (e.g., $SiO_2$ layer) formed thereon. Furthermore, the fusion bonding interface formed between the support substrate 140 and the bonding layer 130 may be a Si—Si fusion bonding interface, a Si—$SiO_2$ fusion bonding interface, a $SiO_2$—$SiO_2$ fusion bonding interface or other suitable fusion bonding interfaces.

Figure 5:
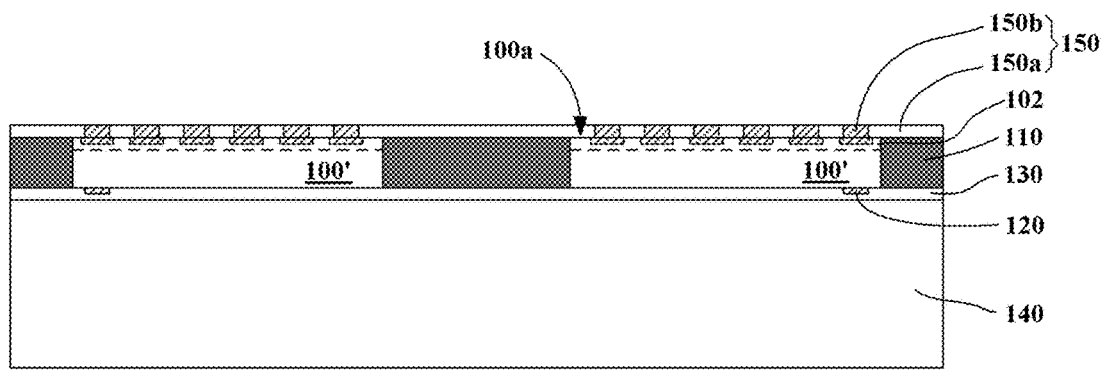

Referring to FIG. 4 and FIG. 5, after bonding the support substrate 140 and the bonding layer 130, a de-bonding or a removal process may be performed such that the bonding layer B and the semiconductor carrier C1 are de-bonded from the semiconductor dies 100' and the first encapsulation portion 110. The de-bonding process may be a laser lift-off process or other suitable removal processes. After removal of the bonding layer B and the semiconductor carrier C1, the active surfaces 100a of the semiconductor dies 100' and a surface of the first encapsulation portion 110 are revealed.

After removal of the bonding layer B and the semiconductor carrier C1, a structure de-bonded from the bonding layer B and the semiconductor carrier C1 is flipped upside down such that the active surfaces 100a of the semiconductor dies 100' and the revealed surface of the first encapsulation portion 110 may face up. A bonding structure 150 is then formed over the active surfaces 100a of the semiconductor dies 100' and the revealed surface of the first encapsulation portion 110. The bonding structure 150 may include a dielectric layer 150a and conductors 150b each penetrating through the dielectric layer 150a. The material of the dielectric layer 150a may be silicon oxide ($SiO_x$, where x>0), silicon nitride ($SiN_x$, where x>0), silicon oxynitirde ($SiO_xN_y$, where x>0 and y>0) or other suitable dielectric material, and the conductors 150b may be conductive vias (e.g., copper vias), conductive pads (e.g., copper pads) or combinations thereof. The bonding layer 150 may be formed by depositing a dielectric material through a chemical vapor deposition (CVD) process (e.g., a plasma enhanced CVD process or other suitable deposition process); patterning the dielectric material to form the dielectric layer 150a including openings or through holes; and filling conductive material in the openings or through holes defined in the dielectric layer 150a to form the conductors 150b embedded in the dielectric layer 150a.

Figure 6:
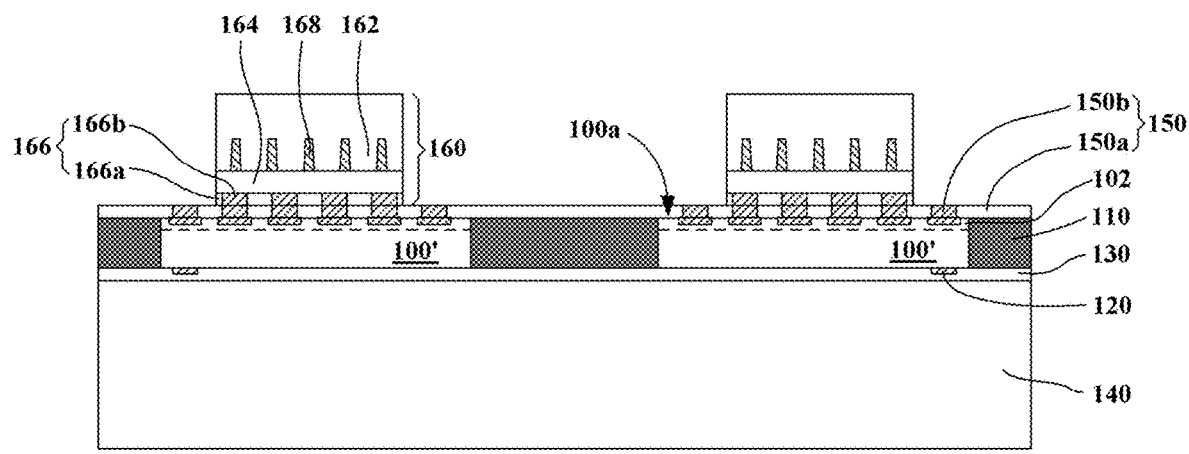

Referring to FIG. 6, semiconductor dies 160 (e.g., memory dies) are provided and placed on portions of the bonding structure 150. In some embodiments, each one of the semiconductor dies 160 is placed over one of the semiconductor dies 100, respectively. Each of the semiconductor dies 160 may include a semiconductor substrate 162, an interconnect structure 164 disposed on the semiconductor substrate 162, a bonding structure 166 disposed on and electrically connected to the interconnect structure 164, and through semiconductor vias 168 formed in the semiconductor substrate 162. The semiconductor dies 160 are placed on the bonding structure 150 such that the bonding structures 166 of the semiconductor dies 160 are in contact with portions of the bonding structure 150. The semiconductor dies 160 may be placed on the bonding structure 150 in a side-by-side manner such that semiconductor dies 160 are spaced apart from each other. The bonding structure 166 may include a dielectric layer 166a and conductors 166b each penetrating through the dielectric layer 166a. The material of the dielectric layers 166a may be silicon oxide ($SiO_x$, where x>0), silicon nitride ($SiN_x$, where x>0), silicon oxynitirde ($SiO_xN_y$, where x>0 and y>0) or other suitable dielectric material, and the conductors 166b may be conductive vias (e.g., copper vias), conductive pads (e.g., copper pads) or combinations thereof.

The conductors 166b of the bonding structure 166 are aligned with the conductors 150b of the bonding structure 150, and sub-micron alignment precision between the semiconductor dies 160 and the bonding structure 150 may be achieved. Once the bonding structures 166 of the semiconductor dies 160 are aligned precisely with the bonding structure 150, a wafer-to-wafer hybrid bonding is performed such that the semiconductor dies 160 are hybrid bonded to the bonding structure 150.

In some embodiments, to facilitate wafer-to-wafer hybrid bonding between the bonding structure 150 and the bonding structures 166 of the semiconductor dies 160, surface preparation for bonding surfaces of the bonding structures 166 and the bonding structure 150 is performed. The surface preparation may include surface cleaning and activation, for example. Surface cleaning may be performed on the bonding surfaces of the bonding structures 166 and the bonding structure 150 so as to remove particles on bonding surfaces of the conductors 150b, the dielectric layer 150a, the conductors 166b, and the dielectric layers 166a. The bonding surfaces of the bonding structures 166 and the bonding structure 150 are cleaned by wet cleaning, for example. Not only particles may be removed, but also native oxide formed on the bonding surfaces of the conductors 150b and the conductors 166b may be removed. The native oxide formed on the bonding surfaces of the conductors 150b and the conductors 166b may be removed by chemicals used in the wet cleaning.

After cleaning the bonding surfaces of the bonding structures 166 and the bonding structure 150, activation of the top surfaces of the dielectric layer 150a and the dielectric layers 166a may be performed for development of high bonding strength. In some embodiments, plasma activation is performed to treat the bonding surfaces of the dielectric layer 150a and the dielectric layers 166a.

When the activated bonding surface of the dielectric layer 150a is in contact with the activated bonding surfaces of the dielectric layers 166a, the dielectric layer 150a of the bonding structure 150 and the dielectric layers 166a of the semiconductor dies 160 are pre-bonded. The semiconductor dies 160 and the bonding structure 150 are pre-bonded through a pre-bonding of the dielectric layer 150a and the dielectric layers 166a. After the pre-bonding of the dielectric layer 150a and the dielectric layers 166a, the conductors 150b are in contact with the conductors 166b.

After the pre-bonding of the dielectric layer 150a and the dielectric layers 166a, a hybrid bonding of the semiconductor dies 160 and the bonding structure 150 is performed. The hybrid bonding of the semiconductor dies 160 and the bonding structure 150 may include a treatment for dielectric bonding and a thermal annealing for conductor bonding. The treatment for dielectric bonding is performed to strengthen the bonding between the dielectric layer 150a and the dielectric layers 166a. The treatment for dielectric bonding may be performed at temperature ranging from about 100 Celsius degree to about 150 Celsius degree, for example. After performing the treatment for dielectric bonding, the thermal annealing for conductor bonding is performed to facilitate the bonding between the conductors 150b and the conductors 166b. The thermal annealing for conductor bonding may be performed at temperature ranging from about 300 Celsius degree to about 400 Celsius degree, for example. The process temperature of the thermal annealing for conductor bonding is higher than that of the treatment for dielectric bonding. Since the thermal annealing for conductor bonding is performed at relative higher temperature, metal diffusion and grain growth may occur at bonding interfaces between the conductors 150b and the conductors 166b. After performing the thermal annealing for conductor bonding, the dielectric layer 150a is bonded to the dielectric layer 166a and the conductors 150b are bonded to the conductors 166b. The conductor bonding between the conductors 150b and the conductors 166b may be via-to-via bonding, pad-to-pad bonding or via-to-pad bonding.

Figure 7:
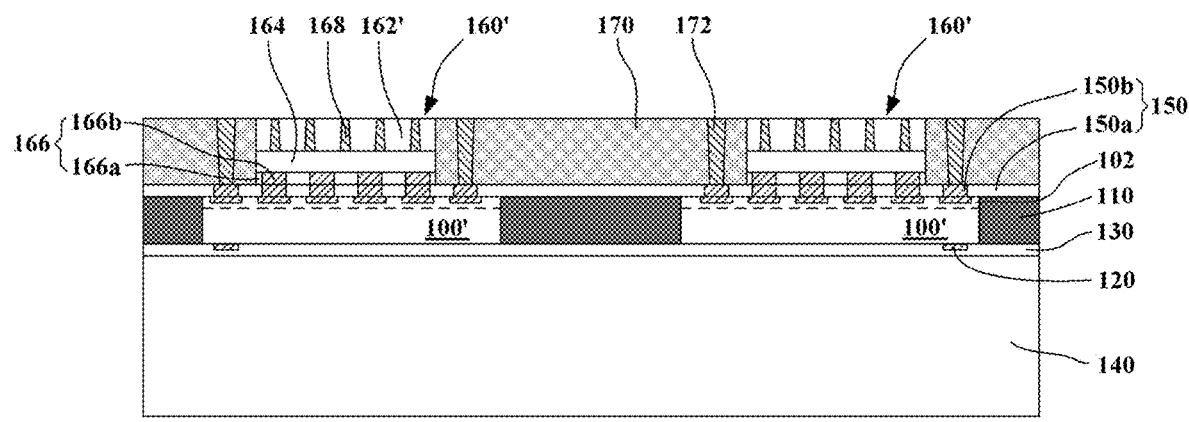

Referring to FIG. 6 and FIG. 7, after the semiconductor dies 160 are bonded to the bonding structure 150, an insulating material is formed to cover the bonding structure 150 and the semiconductor dies 160. In some embodiments, the insulating material is formed by an over-molding process such that back surfaces and side surfaces of the semiconductor dies 160 (illustrated in FIG. 6) are covered by the insulating material. After performing the over-molding process, a grinding process may be performed to reduce the thickness of the insulating material and the thickness of the semiconductor die 160 (illustrated in FIG. 6) such that semiconductor dies 160' with reduced thickness and a second encapsulation portion 170 are formed over the bonding structure 150. After performing the grinding process, semiconductor substrates 162' having reduced thickness are formed, and the through semiconductor vias 168 are revealed from back surfaces of the semiconductor substrates 162'. In some embodiments, the grinding process for reducing the thickness of the insulating material and the thickness of the semiconductor die 160 (illustrated in FIG. 6) includes a mechanical grinding process, a chemical mechanical polishing (CMP) process, or combinations thereof.

As illustrated in FIG. 7, in some embodiments, the thickness of the semiconductor dies 160' is equal to the thickness of the second encapsulation portion 170, and the semiconductor dies 160' are laterally encapsulated by the second encapsulation portion 170. In other words, the second encapsulation portion 170 is merely in contact with side surfaces of the semiconductor dies 160', and back surfaces of the semiconductor dies 160' are accessibly revealed by the second encapsulation portion 170. In some alternative embodiments, not illustrated in FIG. 7, the thickness of the semiconductor dies is slightly less than or greater than the thickness of the second encapsulation portion due to polishing selectivity of the grinding process. In other words, the top surface of the second encapsulation portion may be slightly higher than or slightly lower than the back surface of the semiconductor dies.

Through insulator vias (TIVs) 172 are formed in the second encapsulation portion 170. The TIVs 172 are electrically connected to parts of the conductors 150b which are not covered by the semiconductor dies 160'. The second encapsulation portion 170 may be patterned through a laser drilling process, a photolithography process followed by an etching process or other suitable patterning processes to form through holes in the second encapsulation portion 170, and conductive material may be filled in the through holes to form the TIVs 172. In some embodiments, after through holes are formed in the second encapsulation portion 170, the TIVs 172 are formed by deposition of conductive material followed by a CMP process. For example, a metallic material (e.g., copper) is deposited over the semiconductor dies 160' and the second encapsulation portion 170 to fill the through holes defined in the second encapsulation portion 170, and the metallic material is then polished through a CMP process until the semiconductor dies 160' and the second encapsulation portion 170 are revealed.

Figure 8:
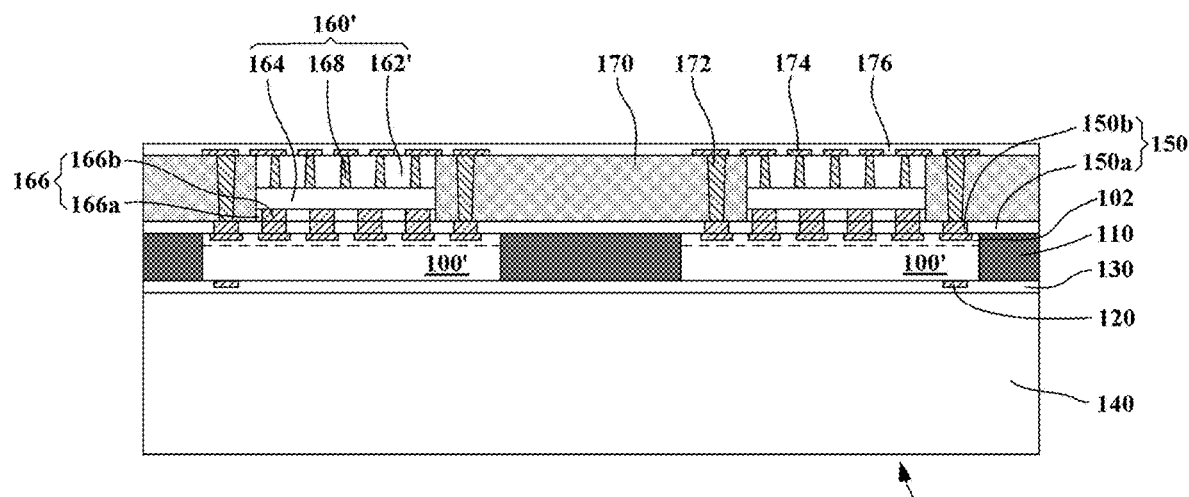

Referring to FIG. 8, a redistribution circuit layer 174 is formed on back surfaces of the semiconductor dies 160' and the second encapsulation portion 170. The redistribution circuit layer 174 may be electrically connected to the semiconductor dies 100' through the TIVs 172. The redistribution circuit layer 174 may be electrically connected to the through semiconductor vias 168 in the semiconductor dies 160'. A passivation layer 176 may be formed on back surfaces of the semiconductor dies 160' and the second encapsulation portion 170 to cover the redistribution circuit layer 174. After forming the redistribution circuit layer 174 and the passivation layer 176, a structure D is fabricated.

Figure 9:
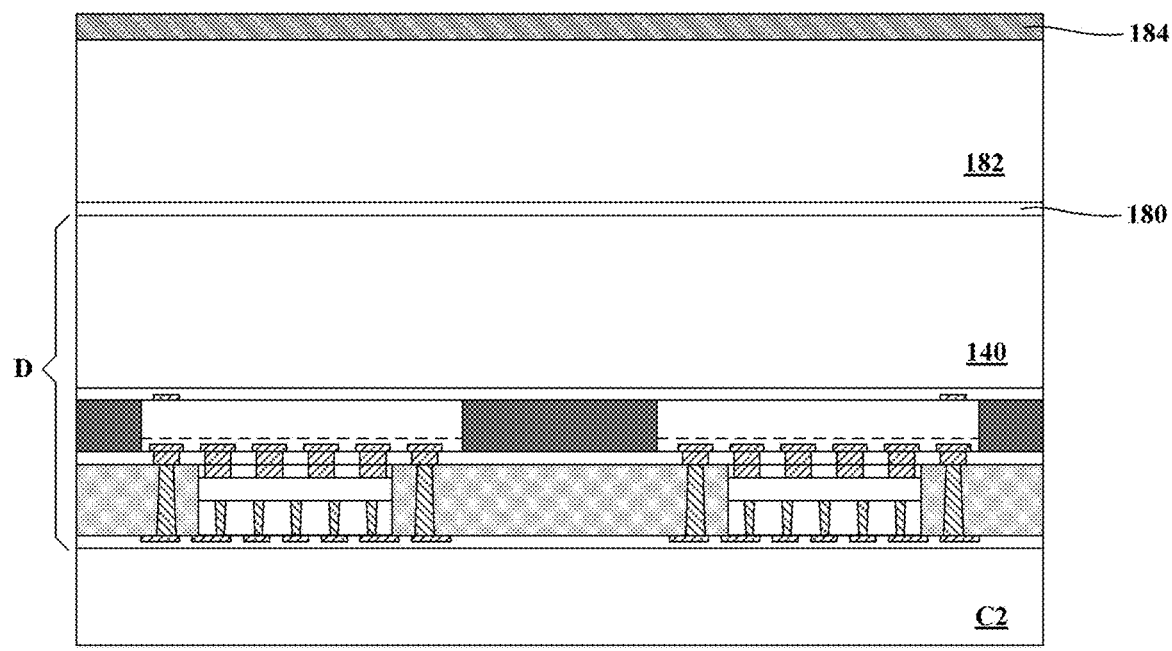

Referring to FIG. 9, the structure D is flipped upside down and transfer-bonded to a semiconductor carrier C2 such that the passivation layer 176 is in contact with the semiconductor carrier C2. A bonding layer 180 is formed on a surface of the support substrate 140 of the structure D carried by the semiconductor carrier C2. The bonding layer 180 may be a deposited bonding layer prepared for fusion bond. For example, the material of the bonding layer 180 includes silicon dioxide ($SiO_2$) or other suitable bonding materials.

After forming the bonding layer 180, a support substrate 182 for warpage control is provided and placed over the bonding layer 180. The thickness of the support substrate 182 may range from about 750 micrometers to about 800 micrometers. For example, as illustrated in FIG. 9, the support substrate 182 is a semiconductor wafer (e.g., a silicon wafer), and the thickness of the support substrate 182 is about 775 micrometers. In some embodiments, a wafer-to-wafer fusion bonding process is performed such that a fusion bonding interface is formed between the support substrate 182 and the bonding layer 180. For example, the fusion bonding process for bonding the support substrate 182 and the bonding layer 180 is performed at temperature ranging from about 250 Celsius degree to about 300 Celsius degree. The support substrate 182 may be directly bonded to the bonding layer 180. In other words, there is no intermediate layer formed between the bonding layer 180 and the support substrate 182. In some alternative embodiments, not illustrated in FIG. 9, the support substrate is a semiconductor wafer (e.g., silicon wafer) having a dielectric bonding layer (e.g., $SiO_2$ layer) formed thereon. Furthermore, the fusion bonding interface formed between the support substrate 182 and the bonding layer 180 may be a Si—$SiO_2$ fusion bonding interface, a $SiO_2$—$SiO_2$ fusion bonding interface or other suitable fusion bonding interfaces.

After performing the fusion bonding process of the support substrate 182 and the bonding layer 180, a backside metal layer 184 may be formed over a surface of the support substrate 182. In other words, the backside metal layer 184 is formed over a surface of the stacked substrates 140 and 182. For example, the thickness of the backside metal layer 184 ranges from about 10 micrometers to about 1000 micrometers to provide proper capability of warpage control. The backside metal layer 184 is disposed over a surface of the stacked substrates 140 and 182, the semiconductor die 110' is disposed over another surface of the stacked substrates 140 and 182. In other words, the backside metal layer 184 and the semiconductor die 110' are disposed at opposite sides of the stacked substrates 140 and 182. In some embodiments, the backside metal layer 184 may include a multi-layered structure metallic structure. For example, the backside metal layer 184 may include an aluminum (Al) layer formed on the surface of the support substrate 182, a titanium (Ti) layer formed on the Al layer, an NiV layer formed on the Ti layer, an Au layer formed on the NiV layer, a copper (Cu) layer formed on the Au layer, and a Ni layer formed no the Cu layer. The thickness of the Al layer may be about 200 micrometers, the thickness of the Ti layer may be about 100 micrometers, the thickness of the NiV layer may be about 350 micrometers, the thickness of the Au layer may be about 100 micrometers, the thickness of the Cu layer may range about 10 micrometers to about 1000 micrometers; and the thickness of the Ni layer may range about 1 micrometers to about 30 micrometers.

Figure 10:
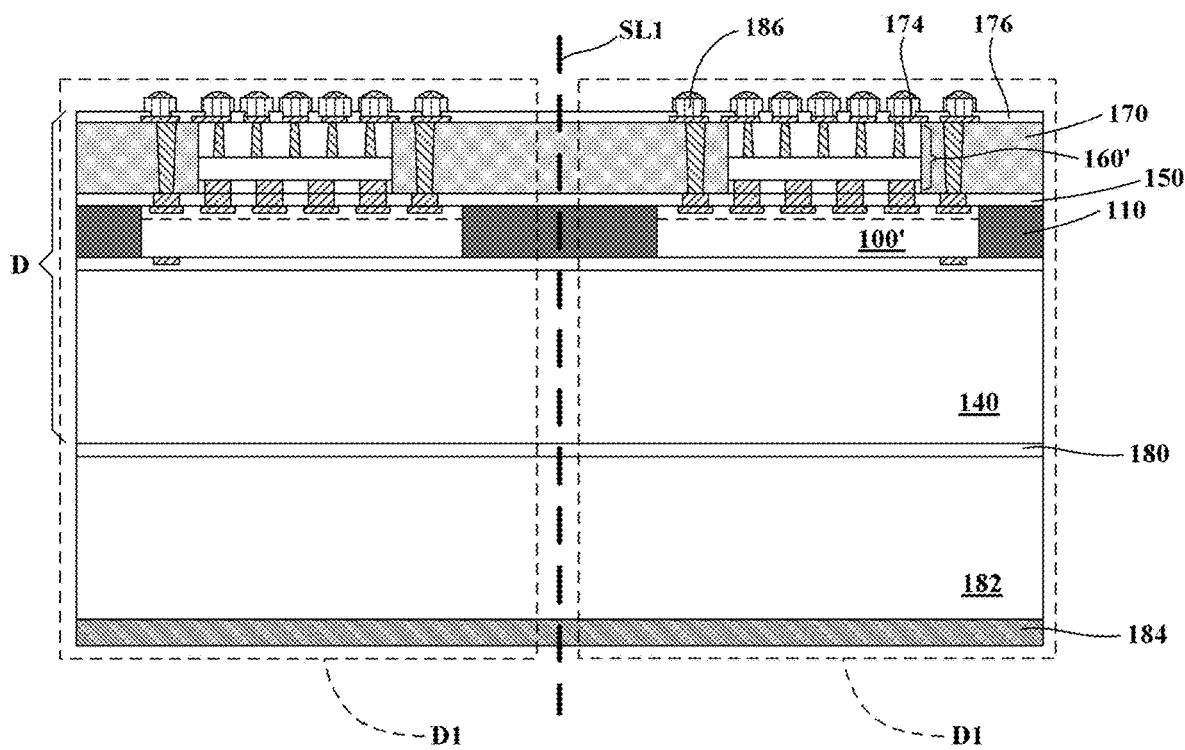

Referring to FIG. 9 and FIG. 10, after forming the backside metal layer 184, the semiconductor carrier C2 is de-bonded from the structure D such that the passivation layer 176 is revealed. The passivation layer 176 is patterned through, for example, a photolithography process followed by an etching process such that the redistribution circuit layer 174 is exposed. Conductive terminals 186 (e.g., conductive bumps) are formed to electrically connect the redistribution circuit layer 174 covered by the passivation layer 176. After the conductive terminals 186 are formed, a singulation process is performed along a scribe line SL1 to obtain multiple singulated SoIC components D1.

The singulated SoIC component D1 includes stacked substrates 140 and 184, a semiconductor die 100', a semiconductor die 160', and an insulating encapsulation, wherein the insulating encapsulation includes a first encapsulation portion 110 encapsulating the semiconductor die 100' and a second encapsulation portion 170 encapsulating the semiconductor die 160'. The semiconductor die 100' is disposed over the stacked substrates 140 and 182. The semiconductor die 160' is stacked over the semiconductor die 100'. The support substrate 140 may be bonded with the support substrate 182 through a bonding layer 180, and the SoIC component D1 may further includes a backside metal layer 284 disposed on a bottom surface of the support substrate 182. In some embodiments, the overall thickness of the stacked substrates 140 and 182 ranges from about 1500 micrometers to about 1600 micrometers to provide proper capability of warpage control. As illustrated in FIG. 10, the first encapsulation portion 110 is disposed over the stacked substrates 140 and 182, and the second encapsulation portion 170 is disposed over the first encapsulation portion 110 and the semiconductor die 100'. Furthermore, the first encapsulation portion 110 is spaced apart from the second encapsulation portion 170 by the bonding layer 150 between the semiconductor die 100' and the semiconductor die 160'.

The support substrate 140 and the support substrate 182 having sufficient overall thickness may be utilized to balance or control warpage of the SoIC component D1. Furthermore, the backside metal layer 184 may be utilized to balance or control warpage of the SoIC component D1.

Figure 11:
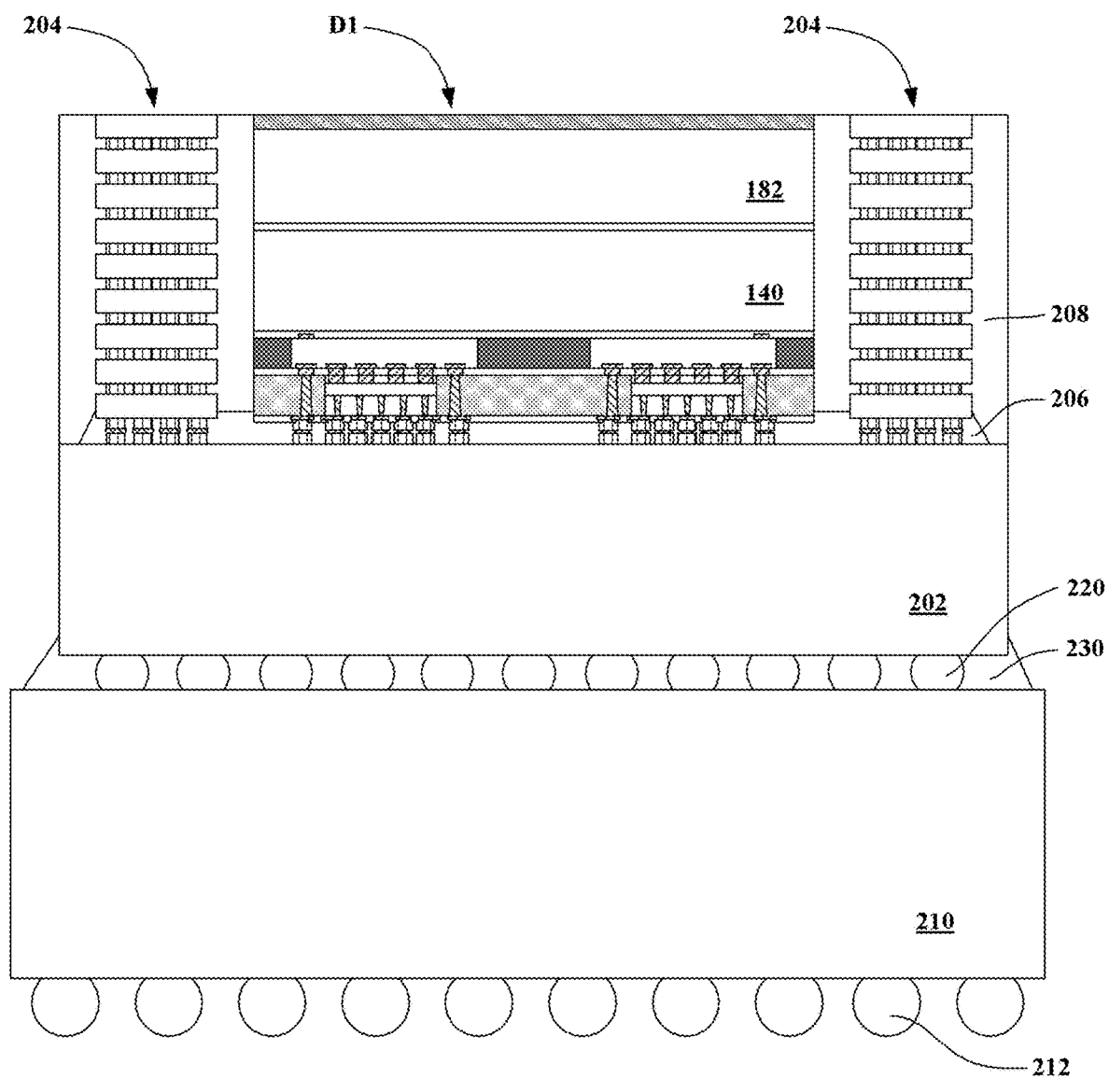
FIG. 11 is a cross-sectional view schematically illustrating a package structure in accordance with some alternative embodiments of the present disclosure.

FIG. 11 is a cross-sectional view schematically illustrating a package structure in accordance with some alternative embodiments of the present disclosure.

Referring to FIG. 10 and FIG. 11, a package structure 200 includes an interposer 202, an SoIC component D1 disposed on and electrically connected to the interposer 202, memory stacks 204 disposed on and electrically connected to the interposer 202, an underfill 206, a insulating encapsulation 208, a circuit substrate 210 having conductive terminals 212, conductive terminals 220, and another underfill 230. The interposer 202 may be a silicon interposer. The memory stacks 204 may be a high bandwidth memory (HBM) cubes including stacked high bandwidth memory dies. The SoIC component D1 and the memory stacks 204 may be electrically connected to the interposer 202 through micro-bumps encapsulated by the underfill 206. The insulating encapsulation 208 may encapsulate the SoIC component D1, the memory stacks 204, and the underfill 206. The interposer 202 may be electrically connected to the circuit substrate 210 through controlled collapse chip connection (C4) bumps 220 encapsulated by the underfill 230. The conductive terminals 212 may be ball grid array (BGA) balls.

In the package structure 200, the backside metal layer 184, the support substrate 140 and the support substrate 182 of the SoIC component D1 may not only control warpage of the SoIC component D1, but also minimize thickness difference between the SoIC component D1 and the memory stacks 204. Since the backside metal layer 184, the support substrate 140 and the support substrate 182 may control warpage of the SoIC component D1, the yield of bonding between the SoIC component D1 and the interposer 202 may increase.

Figure 12:
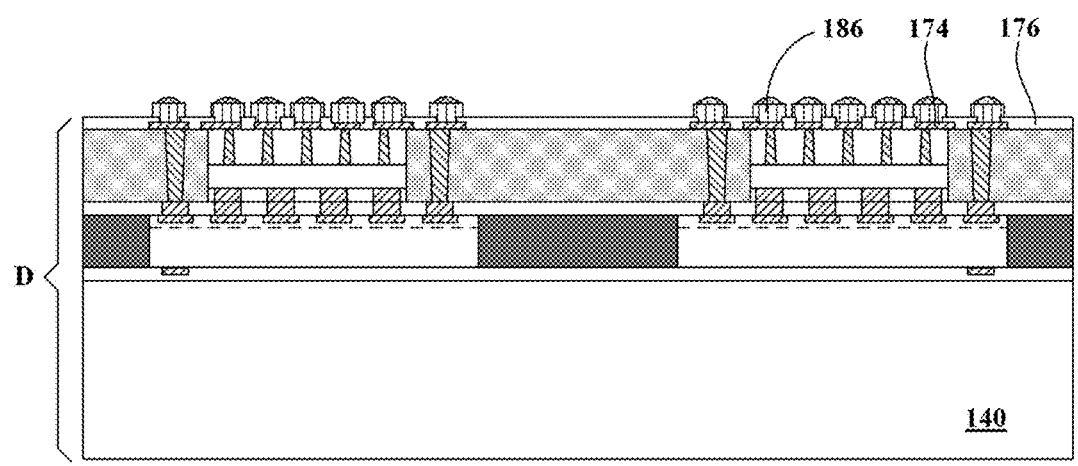
FIG. 12 and FIG. 13 are cross-sectional views schematically illustrating a process flow for fabricating an SoIC component in accordance with other embodiments of the present disclosure.
Figure 13:
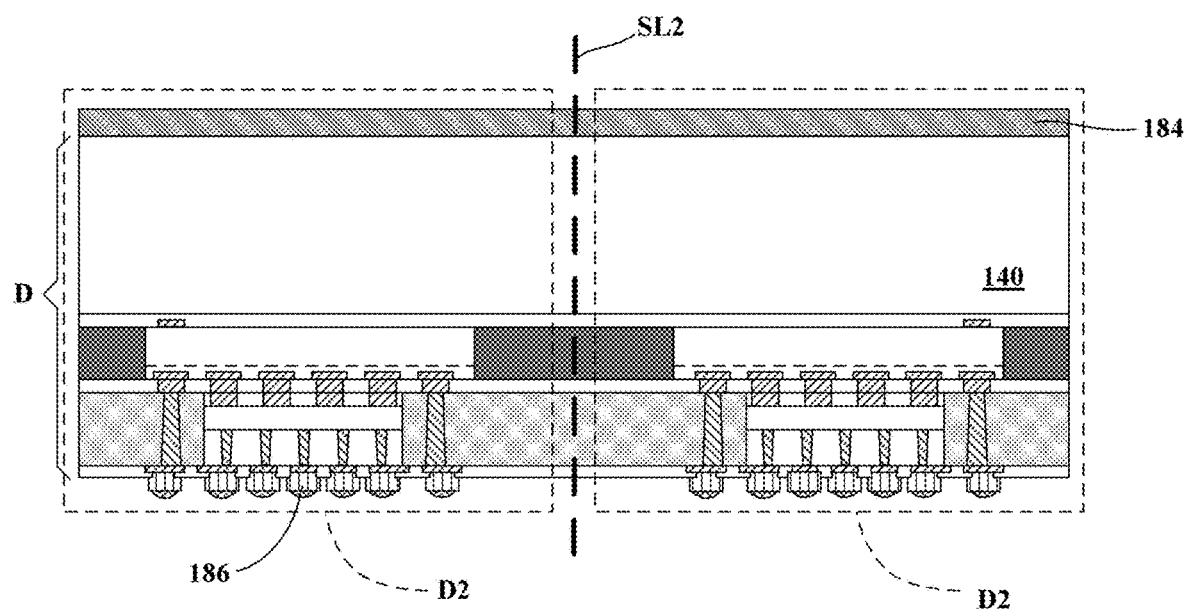

FIG. 12 and FIG. 13 are cross-sectional views schematically illustrating a process flow for fabricating an SoIC component in accordance with other embodiments of the present disclosure.

Referring to FIG. 8 and FIG. 12, after performing the process illustrated in FIG. 8, conductive terminals 186 (e.g., conductive bumps) are formed on the structure D such that the conductive terminals 186 are electrically connected to the redistribution circuit layer 174 covered by the passivation layer 176.

Referring to FIG. 13, after forming the conductive terminals 186, a backside metal layer 184 is formed over a surface of the support substrate 140. For example, the thickness of the backside metal layer 184 ranges from about 10 micrometers to about 1000 micrometers. The backside metal layer 184 and the conductive terminals 186 are disposed at opposite sides of the structure D. After forming the backside metal layer 184, a singulation process is performed along a scribe line SL2 to obtain multiple singulated SoIC components D2.

In FIG. 13, the SoIC component D2 includes a single support substrate 140 and the backside metal layer 184 formed on the support substrate 140. Since the support substrate 140 and backside metal layer 184 may control warpage of the SoIC component D2, the fabrication yield of the SoIC component D2 may increase.

Figure 14:
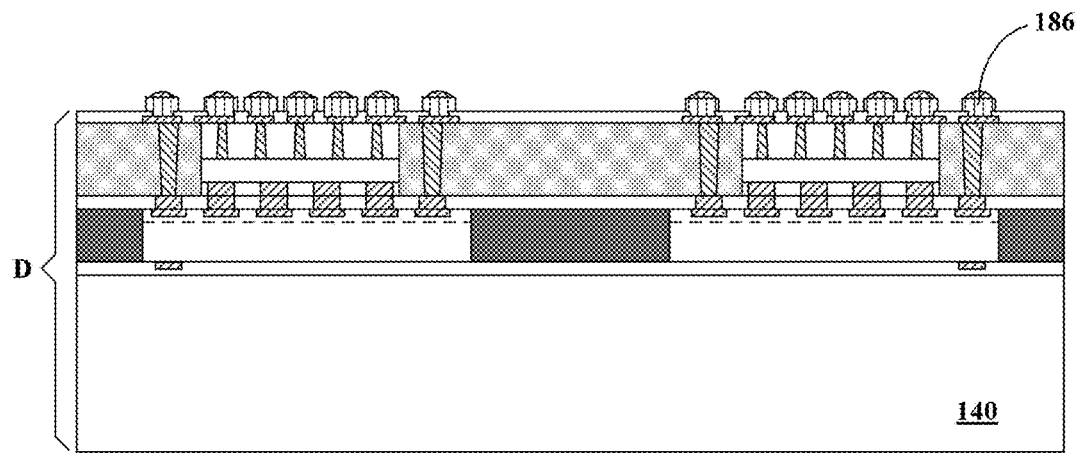
FIG. 14 and FIG. 15 are cross-sectional views schematically illustrating a process flow for fabricating an SoIC component in accordance with another embodiments of the present disclosure.
Figure 15:
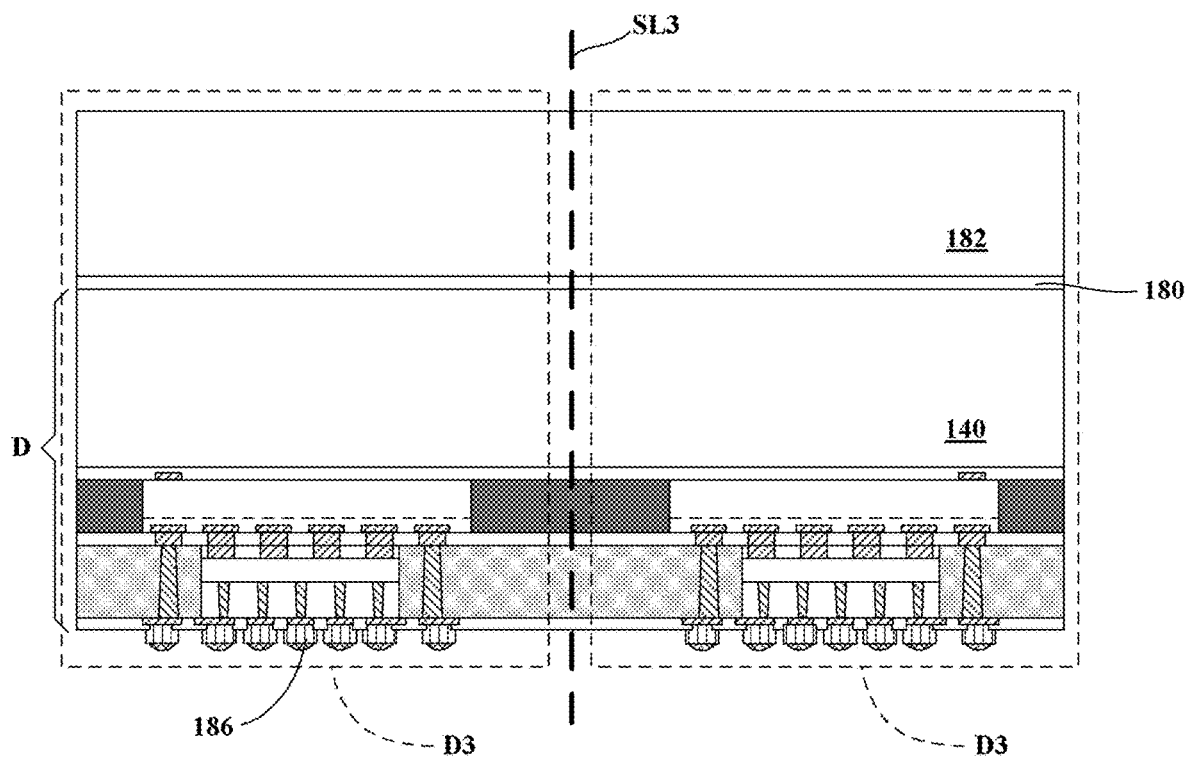
Figure 16:
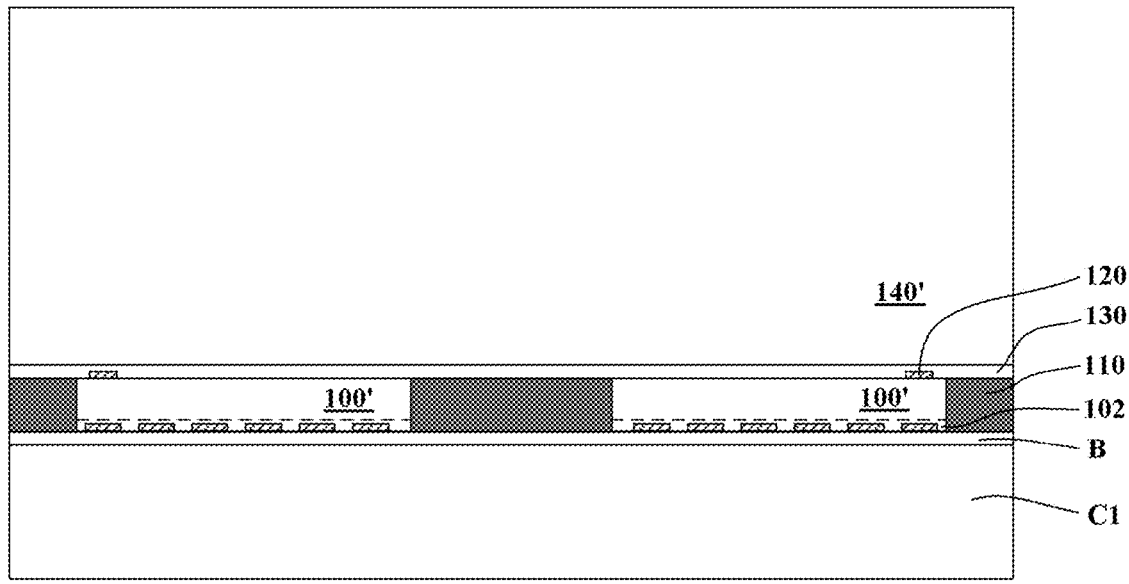
FIG. 16 through FIG. 21 are cross-sectional views schematically illustrating a process flow for fabricating an SoIC component in accordance with some alternative embodiments of the present disclosure.
Figure 17:
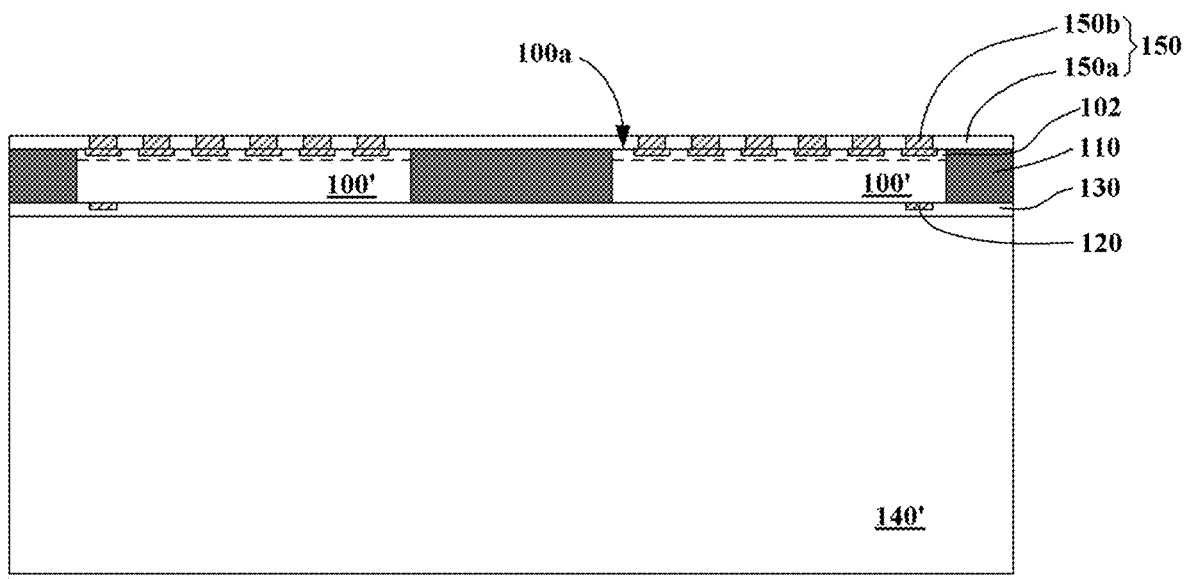
Figure 18:
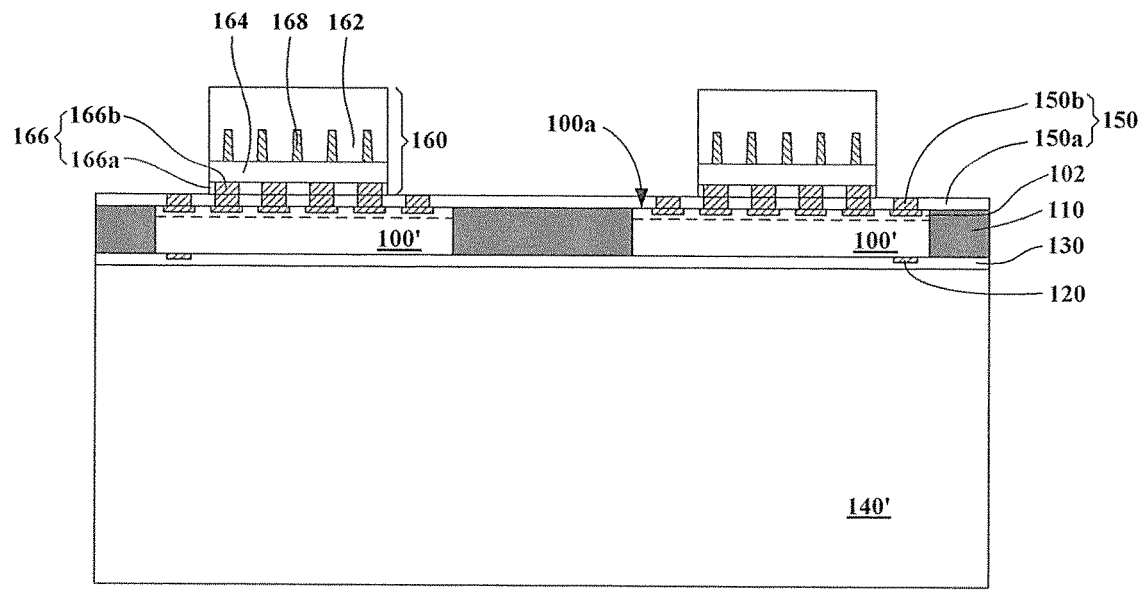
Figure 19:
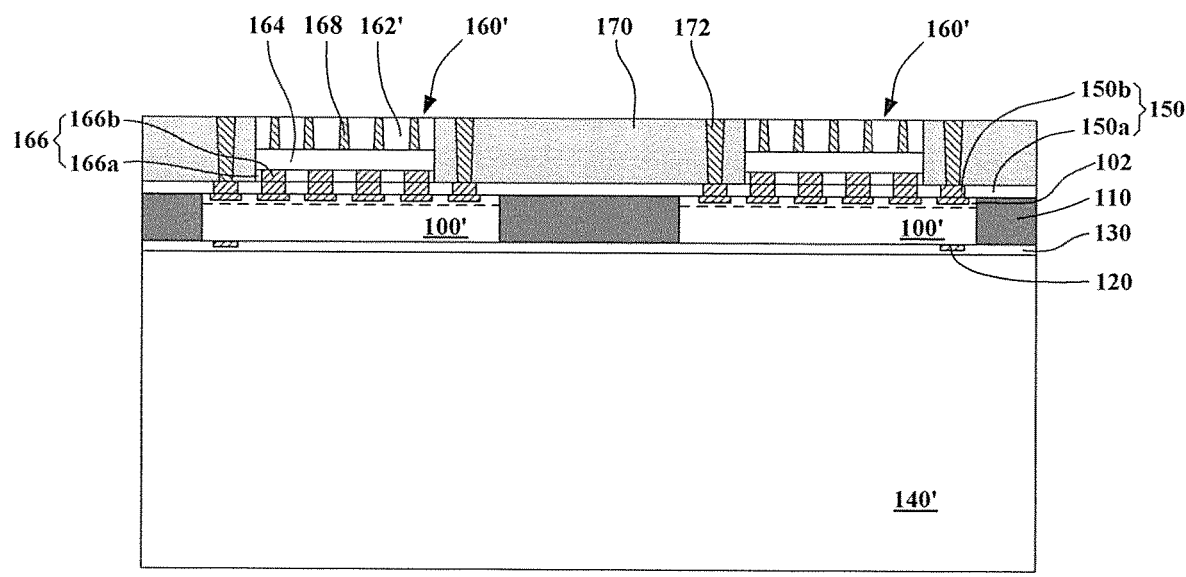

FIG. 14 and FIG. 15 are cross-sectional views schematically illustrating a process flow for fabricating an SoIC component in accordance with another embodiments of the present disclosure.

Referring to FIG. 8 and FIG. 14, after performing the process illustrated in FIG. 8, conductive terminals 186 (e.g., conductive bumps) are formed on the structure D such that the conductive terminals 186 are electrically connected to the redistribution circuit layer 174 covered by the passivation layer 176.

Referring to FIG. 15, the structure D is flipped upside down and a bonding layer 180 is formed on a surface of the support substrate 140 of the structure D. The bonding layer 180 may be a deposited bonding layer prepared for fusion bond. For example, the material of the bonding layer 180 includes silicon dioxide ($SiO_2$) or other suitable bonding materials. After forming the bonding layer 180, a support substrate 182 for warpage control is provided and placed over the bonding layer 180. The thickness of the support substrate 182 may range from about 750 micrometers to about 800 micrometers. For example, as illustrated in FIG. 15, the support substrate 182 is a semiconductor wafer (e.g., a silicon wafer), and the thickness of the support substrate 182 is about 775 micrometers. In some embodiments, a wafer-to-wafer fusion bonding process is performed such that a fusion bonding interface is formed between the support substrate 182 and the bonding layer 180. For example, the fusion bonding process for bonding the support substrate 182 and the bonding layer 180 is performed at temperature ranging from about 250 Celsius degree to about 400 Celsius degree. The support substrate 182 may be directly bonded to the bonding layer 180. In other words, there is no intermediate layer formed between the bonding layer 180 and the support substrate 182. In some alternative embodiments, not illustrated in FIG. 15, the support substrate is a semiconductor wafer (e.g., silicon wafer) having a dielectric bonding layer (e.g., $SiO_2$ layer) formed thereon. Furthermore, the fusion bonding interface formed between the support substrate 182 and the bonding layer 180 may be a Si—$SiO_2$ fusion bonding interface, a $SiO_2$—$SiO_2$ fusion bonding interface or other suitable fusion bonding interfaces.

After performing the bonding of the support substrate 182 and the support substrate 140, a singulation process is performed along a scribe line SL3 to obtain multiple singulated SoIC components D3.

In FIG. 15, the SoIC component D3 includes multiple stacked substrates 140 and 182, and backside metal layer is omitted. An overall thickness of the stacked substrates 140 and 182 ranges from about 1500 micrometers to about 1600 micrometers. Since the stacked substrates 140 and 182 are thick enough to control warpage of the SoIC component D3, the fabrication yield of the SoIC component D3 may increase.

FIG. 16 through FIG. 21 are cross-sectional views schematically illustrating a process flow for fabricating an SoIC component in accordance with some alternative embodiments of the present disclosure.

Figure 20:
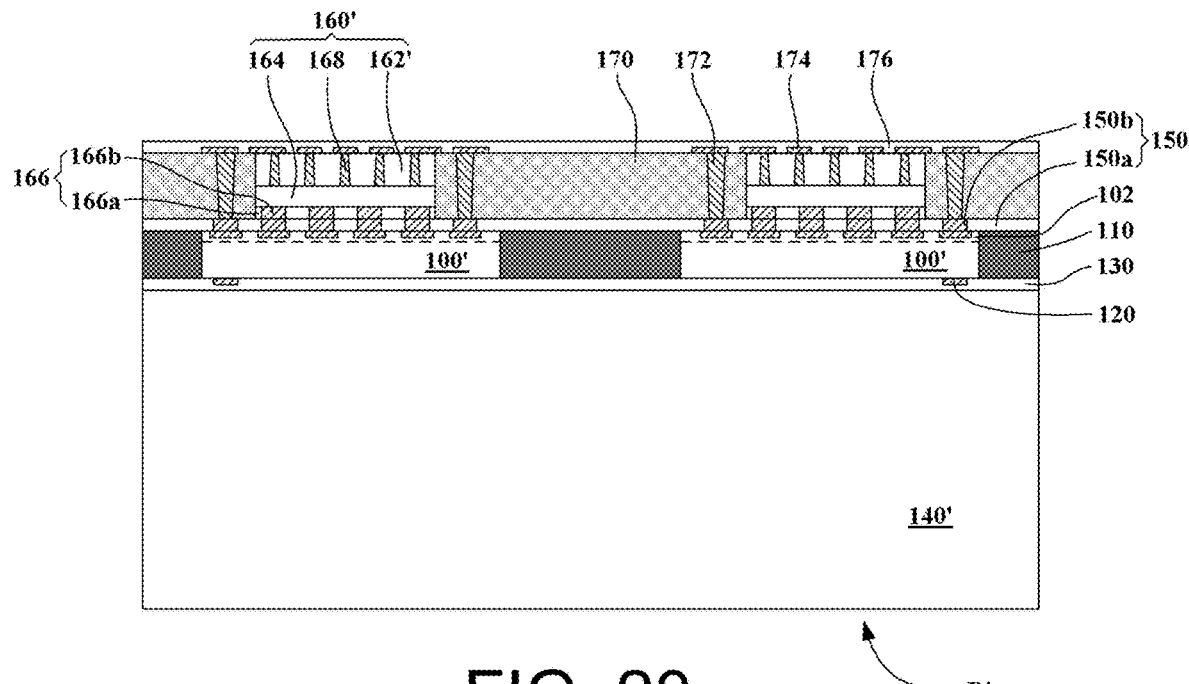

Referring to FIG. 3 and FIG. 16 through 20, after performing the process illustrated in FIG. 3, processes illustrated in FIG. 16 through 20 are performed. The processes illustrated in FIG. 16 through 20 are similar to those illustrated in FIG. 4 through 8 except that a single support substrate 140' used in the present embodiment is thicker. For example, the single support substrate 140' has a thickness ranging from about 1500 micrometers to about 1600 micrometers. As illustrated in FIG. 20, after forming the redistribution circuit layer 174 and the passivation layer 176, a structure D' is fabricated.

Figure 21:
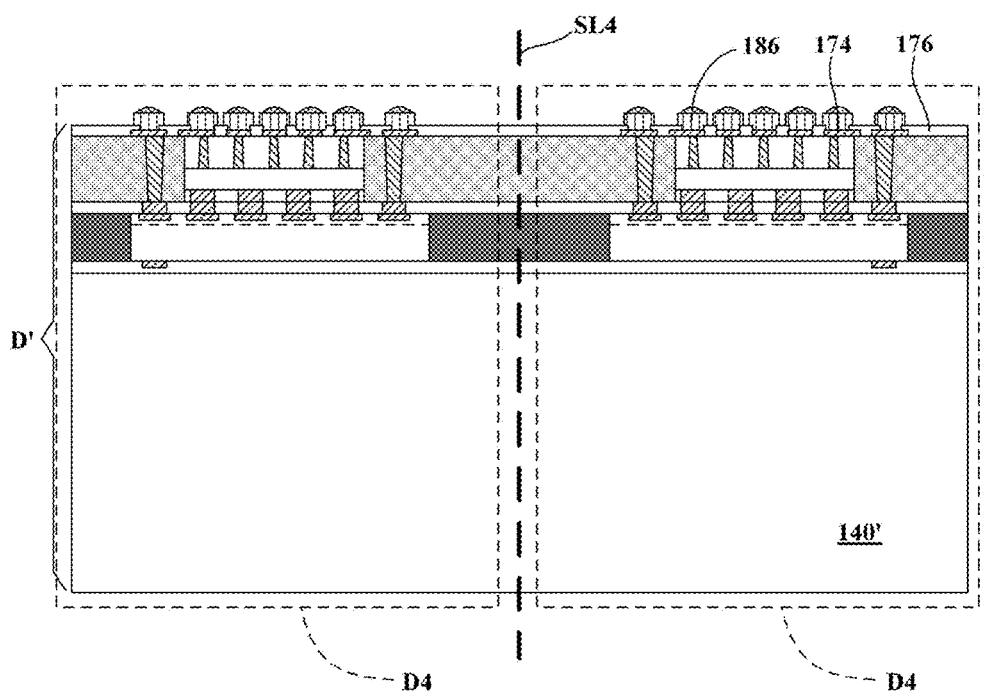

Referring to FIG. 21, conductive terminals 186 (e.g., conductive bumps) are formed on the structure D' such that the conductive terminals 186 are electrically connected to the redistribution circuit layer 174 covered by the passivation layer 176. After forming the conductive terminals 186, a singulation process is performed along a scribe line SL4 to obtain multiple singulated SoIC components D4.

Figure 22:
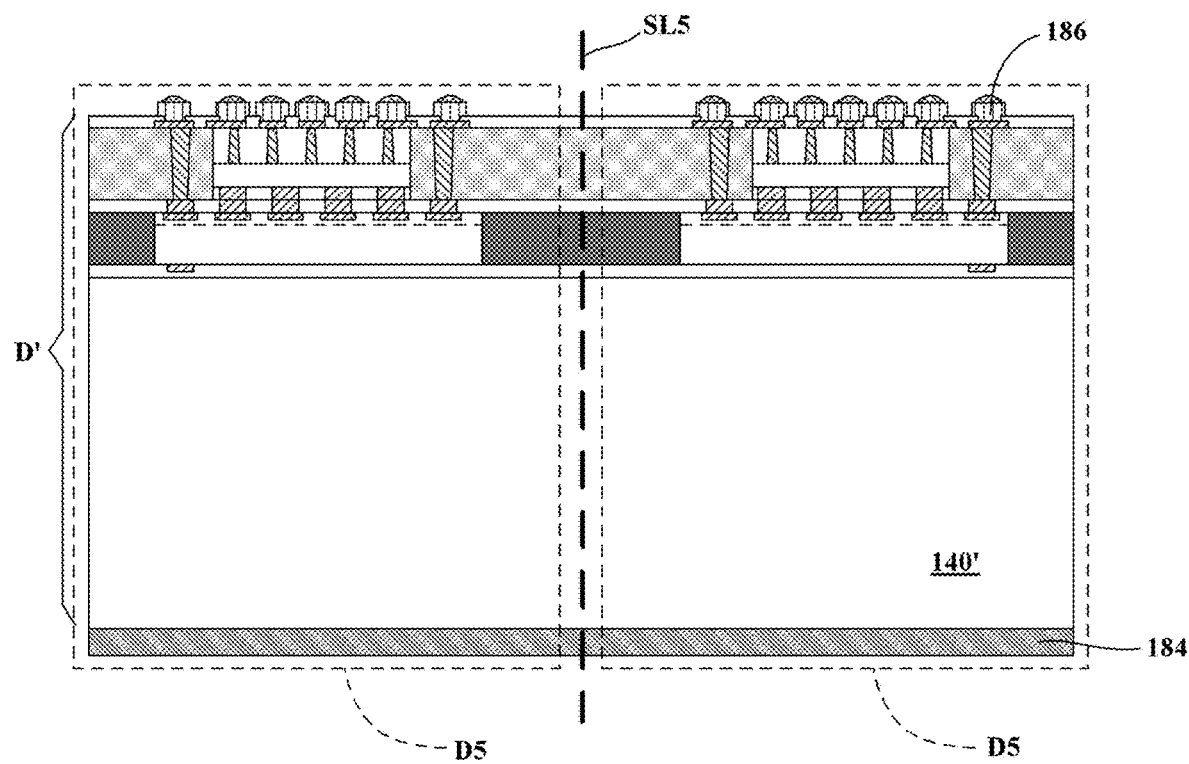
FIG. 22 is a cross-sectional view schematically illustrating another SoIC component in accordance with some embodiments of the present disclosure.

FIG. 22 is a cross-sectional view schematically illustrating another SoIC component in accordance with some embodiments of the present disclosure.

Referring to FIG. 21 and FIG. 22, the structure illustrated in FIG. 22 is similar to the structure illustrated in FIG. 21 except for a backside metal layer 184 on the bottom surface of the single support substrate 140'. After forming the backside metal layer 184 on the bottom surface of the single support substrate 140', a singulation process is performed along a scribe line SL5 to obtain multiple singulated SoIC components D5.

Although the package structure 200 including the SoIC components D1 is illustrated in FIG. 11, other types of SoIC components, such as SoIC components D2, D3, D4 or D5 may be packed in the package structure 200 as illustrated in FIG. 11.

In accordance with some embodiments of the disclosure, a structure including stacked substrates, a first semiconductor die, a second semiconductor die, and an insulating encapsulation is provided. The first semiconductor die is disposed over the stacked substrates. The second semiconductor die is stacked over the first semiconductor die. The insulating encapsulation includes a first encapsulation portion encapsulating the first semiconductor die and a second encapsulation portion encapsulating the second semiconductor die. In some embodiments, an overall thickness of the stacked substrates ranges from about 1500 micrometers to about 1600 micrometers. In some embodiments, the first encapsulation portion being disposed over the stacked substrates, and the second encapsulation portion is disposed over the first encapsulation portion and the first semiconductor die. In some embodiments, the first encapsulation portion is spaced apart from the second encapsulation portion by a bonding layer between the first semiconductor die and the second semiconductor die. In some embodiments, the structure further includes a backside metal layer disposed over the stacked substrates, wherein the backside metal layer is disposed over a first surface of the stacked substrates, the first semiconductor die is disposed over a second surface of the stacked substrates, and the first surface is opposite to the second surface. In some embodiments, a thickness of the backside metal layer ranges from about 10 micrometers to about 1000 micrometers.

In accordance with some other embodiments of the disclosure, a structure including a support substrate, a first semiconductor die, a second semiconductor die, a metal layer, and an insulating encapsulation is provided. The first semiconductor die is disposed over a first surface of the support substrate. The second semiconductor die is disposed over the first semiconductor die. The metal layer is disposed over a second surface of the support substrate, and the first surface is opposite to the second surface. The insulating encapsulation includes a first encapsulation portion encapsulating the first semiconductor die and a second encapsulation portion encapsulating the second semiconductor die. In some embodiments, a thickness of the support substrate ranges from about 1500 micrometers to about 1600 micrometers. In some embodiments, the first encapsulation portion is disposed over the first surface of the support substrate, and the second encapsulation portion is disposed over the first encapsulation portion and the first semiconductor die to laterally encapsulate the second semiconductor die. In some embodiments, the first encapsulation portion is spaced apart from the second encapsulation portion by a bonding layer between the first semiconductor die and the second semiconductor die. In some embodiments, a thickness of the metal layer ranges from about 10 micrometers to about 1000 micrometers. In some embodiments, the support substrate includes a single support substrate having a thickness ranging from about 1500 micrometers to about 1600 micrometers.

In accordance with some other embodiments of the disclosure, a method including the followings is provided. First semiconductor dies are bonded to a carrier, wherein the first semiconductor dies are spaced apart from each other, and front surfaces of the first semiconductor dies face the carrier. A first encapsulation portion is formed over the carrier to laterally encapsulating the first semiconductor dies. The carrier is removed from the front surfaces of the first semiconductor dies and the first encapsulation portion. A bonding layer is formed on the front surfaces of the first semiconductor dies and the first encapsulation portion. Second semiconductor dies are bonded to the bonding layer, wherein front surfaces of the second semiconductor dies face the bonding layer. A second encapsulation portion is formed over the bonding layer to laterally encapsulating the second semiconductor dies. After forming the first encapsulation portion over the carrier to laterally encapsulating the first semiconductor dies, a support substrate is bonded to back surfaces of the first semiconductor dies and the first encapsulation portion. In some embodiments, the support substrate includes a single support substrate. In some embodiments, the support substrate is bonded to the back surfaces of the first semiconductor dies and the first encapsulation portion before removing the carrier from the front surfaces of the first semiconductor dies and the first encapsulation portion. In some embodiments, the method further includes: forming a redistribution circuit layer on back surfaces of the second semiconductor dies and the second encapsulation portion; and forming conductive terminals on the redistribution circuit layer. In some embodiments, the support substrate includes a first support substrate and a second support substrate bonded to the first support substrate. In some embodiments, the first support substrate is bonded to the back surfaces of the first semiconductor dies and the first encapsulation portion before removing the carrier from the front surfaces of the first semiconductor dies and the first encapsulation portion. In some embodiments, the second support substrate is bonded to the first support substrate after forming the redistribution circuit layer on the second semiconductor dies and the second encapsulation portion; and the second support substrate is bonded to the back surfaces of the first semiconductor dies and the first encapsulation portion before forming the conductive terminals on the redistribution circuit layer. In some embodiments, the second support substrate is bonded to the first support substrate after forming the conductive terminals on the redistribution circuit layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   stacked substrates;
   a first semiconductor die disposed over the stacked substrates;
   a second semiconductor die stacked over the first semiconductor die;
   an insulating encapsulation comprising a first encapsulation portion encapsulating the first semiconductor die and a second encapsulation portion encapsulating the second semiconductor die; and
   a bonding layer between the first semiconductor die and the second semiconductor die, wherein the first encapsulation portion is spaced apart from the second encapsulation portion by the bonding layer.

2. The structure as claimed in claim 1, wherein an overall thickness of the stacked substrates ranges from about 1500 micrometers to about 1600 micrometers.

3. The structure as claimed in claim 1, wherein the first encapsulation portion is disposed over the stacked substrates, and the second encapsulation portion is disposed over the first encapsulation portion and the first semiconductor die.

4. The structure as claimed in claim 1, wherein the bonding layer comprises a dielectric layer and conductors embedded in the dielectric layer.

5. The structure as claimed in claim 1, further comprising a backside metal layer disposed over the stacked substrates, wherein the stacked substrates are between the backside metal layer and the first semiconductor die.

6. The structure as claimed in claim 5, wherein a thickness of the backside metal layer ranges from about 10 micrometers to about 1000 micrometers.

7. A structure, comprising:
   a support substrate;
   a first semiconductor die disposed over a first surface of the support substrate;
   a second semiconductor die disposed over the first semiconductor die;
   a first insulating encapsulation comprising a first encapsulation portion encapsulating the first semiconductor die and a second encapsulation portion encapsulating the second semiconductor die; and
   a second insulating encapsulation laterally encapsulating the support substrate, the first semiconductor die, the second semiconductor die and the first insulating encapsulation.

8. The structure as claimed in claim 7, wherein a thickness of the support substrate ranges from about 1500 micrometers to about 1600 micrometers.

9. The structure as claimed in claim 7, wherein the first encapsulation portion is disposed over the first surface of the support substrate, and the second encapsulation portion is disposed over the first encapsulation portion and the first semiconductor die to laterally encapsulate the second semiconductor die.

10. The structure as claimed in claim 7, wherein the first encapsulation portion is spaced apart from the second encapsulation portion by a bonding layer between the first semiconductor die and the second semiconductor die.

11. The structure as claimed in claim 7, wherein a thickness of the metal layer ranges from about 10 micrometers to about 1000 micrometers.

12. The structure as claimed in claim 7 further comprising:
    a metal layer disposed over a second surface of the support substrate, wherein the first surface is opposite to the second surface, and the metal layer is laterally encapsulated by the second insulating encapsulation.

13. A method, comprising:
    bonding first semiconductor dies to a carrier, the first semiconductor dies being spaced apart from each other, and front surfaces of the first semiconductor dies facing the carrier;
    forming a first encapsulation portion over the carrier to laterally encapsulating the first semiconductor dies;
    removing the carrier from the front surfaces of the first semiconductor dies and the first encapsulation portion;
    forming a bonding layer on the front surfaces of the first semiconductor dies and the first encapsulation portion;
    bonding second semiconductor dies to the bonding layer, front surfaces of the second semiconductor dies facing the bonding layer;
    forming a second encapsulation portion over the bonding layer to laterally encapsulate the second semiconductor dies; and
    after forming the first encapsulation portion over the carrier to laterally encapsulating the first semiconductor dies, bonding a support substrate comprising stacked substrates to back surfaces of the first semiconductor dies and the first encapsulation portion.

14. The method as claimed in claim 13, wherein the support substrate comprises stacked substrates fusion bonded through at least one bonding layer.

15. The method as claimed in claim 14, wherein the support substrate is bonded to the back surfaces of the first semiconductor dies and the first encapsulation portion before removing the carrier from the front surfaces of the first semiconductor dies and the first encapsulation portion.

16. The method as claimed in claim 13, further comprising:
    forming a redistribution circuit layer on back surfaces of the second semiconductor dies and the second encapsulation portion; and
    forming conductive terminals on the redistribution circuit layer.

17. The method as claimed in claim 16, wherein the support substrate comprises a first support substrate and a second support substrate bonded to the first support substrate.

18. The method as claimed in claim 17, wherein the first support substrate is bonded to the back surfaces of the first semiconductor dies and the first encapsulation portion before removing the carrier from the front surfaces of the first semiconductor dies and the first encapsulation portion.

19. The method as claimed in claim 18, wherein
the second support substrate is bonded to the first support substrate after forming the redistribution circuit layer on the second semiconductor dies and the second encapsulation portion, and
the second support substrate is bonded to the back surfaces of the first semiconductor dies and the first encapsulation portion before forming the conductive terminals on the redistribution circuit layer.

20. The method as claimed in claim 18, wherein the second support substrate is bonded to the first support substrate after forming the conductive terminals on the redistribution circuit layer.

* * * * *